US007253506B2

(12) United States Patent
Keating

(10) Patent No.: US 7,253,506 B2
(45) Date of Patent: Aug. 7, 2007

(54) MICRO LEAD FRAME PACKAGE

(75) Inventor: David Keating, Limerick (IE)

(73) Assignee: Power-One, Inc., Camarillo, CA (US)

( * ) Notice: Subject to any disclaimer, the term of this patent is extended or adjusted under 35 U.S.C. 154(b) by 250 days.

(21) Appl. No.: 10/602,100

(22) Filed: Jun. 23, 2003

(65) Prior Publication Data

US 2005/0003583 A1 Jan. 6, 2005

(51) Int. Cl.
*H01L 23/495* (2006.01)
*H01L 21/00* (2006.01)
*H01R 9/00* (2006.01)

(52) U.S. Cl. .................. 257/676; 257/690; 257/787; 257/E23.037; 257/E23.052; 257/E33.606; 438/123; 361/775; 361/813

(58) Field of Classification Search .............. 257/666, 257/670, 672, 676, 690, 692, 784; 361/723, 361/813; 438/110, 111, 123
See application file for complete search history.

(56) References Cited

U.S. PATENT DOCUMENTS

| 3,791,025 | A | * | 2/1974 | Guarjado ................. 29/827 |
| 3,810,300 | A | | 5/1974 | Hulmese et al. |
| 5,229,640 | A | * | 7/1993 | Pak .......................... 257/666 |
| 5,267,379 | A | * | 12/1993 | Pak .......................... 29/25.35 |
| 5,504,370 | A | | 4/1996 | Lin et al. |
| 5,541,446 | A | * | 7/1996 | Kierse ..................... 257/666 |
| 5,945,728 | A | * | 8/1999 | Dobkin et al. .............. 257/666 |
| 6,348,726 | B1 | * | 2/2002 | Bayan et al. ............... 257/666 |
| 6,617,197 | B1 | * | 9/2003 | Bayan et al. ............... 438/112 |
| 6,624,511 | B2 | * | 9/2003 | Sakamoto et al. .......... 257/734 |
| 6,844,614 | B2 | * | 1/2005 | Yamada et al. ............. 257/666 |
| 7,042,071 | B2 | * | 5/2006 | Minamio et al. ........... 257/670 |
| 2003/0071344 | A1 | | 4/2003 | Matsuzawa et al. |
| 2003/0076666 | A1 | | 4/2003 | Daeche et al. |

OTHER PUBLICATIONS

"Patent Abstracts of Japan" Publication No. 2003086756 (Mar. 30, 2003); Denso Corp.

* cited by examiner

*Primary Examiner*—Alonzo Chambliss
(74) *Attorney, Agent, or Firm*—O'Melveny & Myers LLP

(57) ABSTRACT

The present invention comprises a lead frame substrate adapted to receive semiconductor die and multiple passive components. The lead frame substrate is preferably formed from a single piece of electrically conductive material, such as copper, and may be mounted within a lead frame package or directly onto a circuit board. The lead frame substrate includes mounting surfaces adapted to receive the semiconductor dice and passive components. The mounting surfaces are linked together by temporary and/or permanent connection bars. A method to manufacture the lead frame package includes, among other steps, forming a lead frame substrate, applying a molding compound to the lead frame substrate to fix each mounting surface and connection bar in place, removing the temporary connection bars, mounting the semiconductor components on the lead frame substrate, and applying a packaging material over the lead frame substrate to encapsulate the semiconductor components.

12 Claims, 10 Drawing Sheets

MICRO LEAD FRAME PACKAGE

FIELD OF THE INVENTION

The present invention generally relates to the field of micro lead frame design packaging and assembly. More specifically, the present invention comprises a micro lead frame substrate that is adapted to receive at least one semiconductor die and multiple discrete passive components which may be mounted within a lead frame or directly onto a circuit board.

BACKGROUND OF THE INVENTION

Today's multi chip modules (MCM's) in power applications face significant challenges in terms of heat dissipation and heat management. Coupled with the need to dissipate heat in a uniform manner with low thermal impedance, there is also a need to reduce space and cost. Traditional approaches to packaging MCM's have been in the form of a Land Grid Array (LGA) or Ball Grid Array (BGA) type substrate, which consist of multiple chips (semiconductor dice) plus passive components placed on a laminate substrate. The substrate material conventionally has a high-thermal impedance and, even with enhanced via technology for heat management, still falls short of the low thermal impedance of a lead frame design.

A conventional lead frame device has excellent thermal conductance and optimum heat dissipation with regard to the power component mounting surfaces. But, a conventional lead frame design and manufacturing process limits its ability to have multiple passive components mounted within the package. Manufacturing a lead frame that is adapted to receive a power semiconductor die and passive components is often associated with long manufacturing times, increased expenses, and is generally not considered an efficient manufacturing option. Conventional lead frames are adapted to receive only power semiconductor dice. Thus, external components must be coupled to the lead frame to ensure operational effectiveness, which also adds to both the cost (of procurement, placement, etc.) and the space of the customer's board.

FIGS. 1A-1B illustrate a conventional lead frame package 10. The lead frame includes a semiconductor die pad 14 and multiple leads 16 arranged about the periphery of the lead frame 10. A conventional method for producing the leadless semiconductor chip package shown in FIGS. 1A-1B comprises the steps of: (1) attaching a semiconductor chip 12 onto the die pad 14 of a lead frame 10, wherein the lead frame 10 comprises a plurality of leads 16 arranged about the periphery of the die pad 14; (2) wire-bonding the leads of the lead frame 10 to bonding pads on the semiconductor chip (shown as wires 18 in FIG. 1b); and (3) forming a package body 20 over the semiconductor chip 12 and the lead frame 10 in a manner that each lead 16 of the lead frame 10 has at least a portion 17 exposed from the bottom of the package body. This conventional lead frame package 10 only supports a single semiconductor chip 12. The package 10 cannot support any passive components. Thus, the passive components (e.g., resistors and capacitors) are necessarily external to the package 10.

SUMMARY OF THE INVENTION

The proposed invention resolves many of these issues by providing a lead frame substrate that is adapted to receive discrete passive components and may be placed within a micro lead frame package or directly onto a circuit board, and further providing a method of manufacturing the lead frame.

An aspect of the present invention is to provide a lead frame package that is relatively low in cost, has a relatively simple construction, and integrates a power semiconductor die and passive components within the package. In one embodiment, a micro lead frame substrate ("MLF substrate") that includes a semiconductor die pad electrically coupled to multiple termination pads is mounted on a lead frame. The semiconductor die pad is adapted to receive a power semiconductor die (e.g., a MOSFET), a controller ASIC, a PWM controller, or the like. The termination pads are adapted to receive discrete passive components (e.g., resistors and capacitors) or a bonding wire. All of the semiconductor components are therefore located within the same package.

Another aspect of the present invention is to provide a package in which the MLF substrate may be configured to meet the specific package requirements. In one embodiment, the termination pads within the MLF substrate are linked together by a combination of temporary and permanent connection bars. The temporary connection bars provide rigidity to the MLF substrate and are eventually removed. The temporary connection bars do not provide an electrical connection between termination pads in the final lead frame package. The permanent connection bars electrically couple the semiconductor die pads and the termination pads together.

Yet, another aspect of the present invention is to provide a MLF substrate for a semiconductor package. In one embodiment, the lead frame includes a housing with a center pad and leads around its periphery. The MLF substrate mounts on the center pad of the lead frame and is electrically coupled to the leads. Thus, the lead frame package includes discrete passive components and saves customer board space. In another embodiment, the MLF substrate is mounted directly onto the customer board, so that heat generated by a power semiconductor die is dissipated directly into the customer board. In yet another embodiment, only the semiconductor die pads and the leads of the MLF substrate contact the customer board. The bottom surface of the MLF substrate has a stepped feature whereby the contact pads (e.g., power semiconductor die pads, controller pads, and leads) are thicker than the non-contact portions of the MLF substrate (e.g., permanent connection bars).

Still another aspect of the present invention is to provide a method for manufacturing a lead frame package that includes power semiconductor dice and multiple passive components. In one embodiment, the MLF substrate is stamped out of a single piece of material. Alternatively, the MLF substrate may be formed by an etching or laser manufacturing process. A molding compound is applied to the MLF substrate to support the semiconductor die and termination pads. The temporary connection bars are preferably removed before the semiconductor components are mounted on the MLF substrate. In another embodiment, the temporary connection bars are removed after the semiconductor components are mounted on the MLF substrate. The semiconductor components are mounted onto the MLF substrate by a surface mount technology.

Another aspect of the present invention is to manufacture a lead frame package using the MLF substrate above, including the steps of applying a molding compound over the MLF substrate to provide support for the termination pads, the semiconductor die pads, the temporary connection bars, and the permanent connection bars. Once the molding compound has been applied, the temporary connection bars may be removed. Each power semiconductor die is mounted to a semiconductor die pad and the passive components are mounted across specific termination pads. After the semiconductor components are mounted and the termination pads and semiconductor dice are wire bonded to leads, a mold material is applied to the MLF substrate to encapsulate the semiconductor components and bonding wires.

DETAILED DESCRIPTION OF THE INVENTION

Several embodiments of the present invention will now be described with reference to FIGS. 2-9. In general, the present invention provides an MLF substrate that allows power semiconductor components, as well as passive components, to be mounted within the same package. The invention can be applied to, but is not limited to, providing optimum thermal performance within a package that requires multiple or single silicon die combined with single or multiple passive components. The invention may replace existing micro lead frame products that require external passives by placing the external components within the package, and thus reducing space and cost.

Figure 1A:
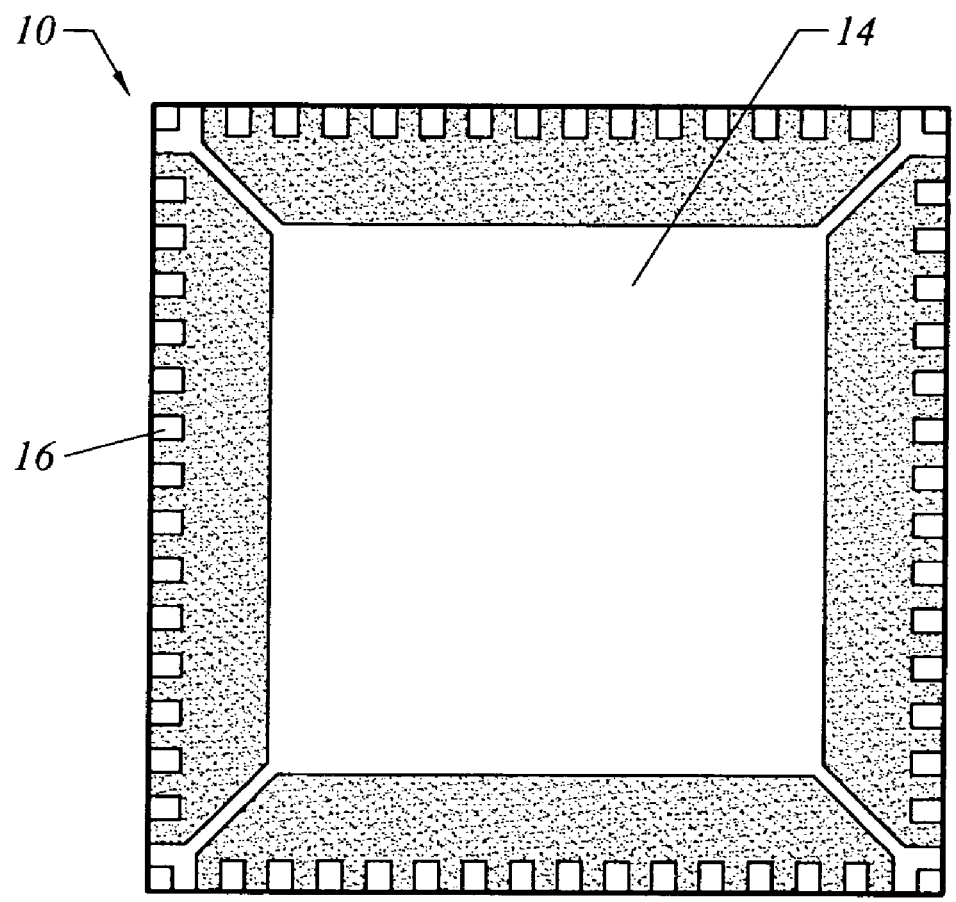
FIGS. 1A-1B illustrate a conventional lead frame, according to the prior art.
Figure 1B:
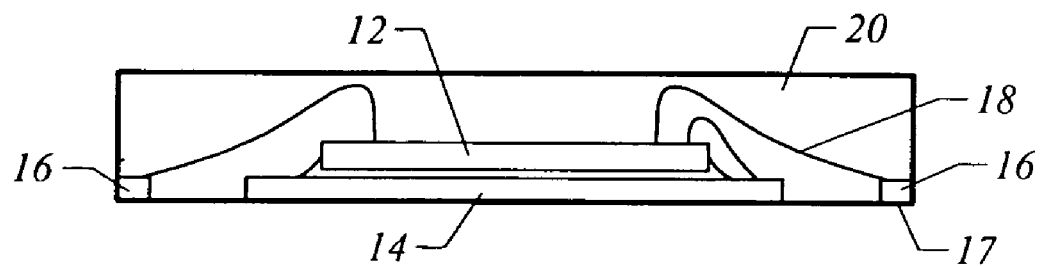
Figure 2:
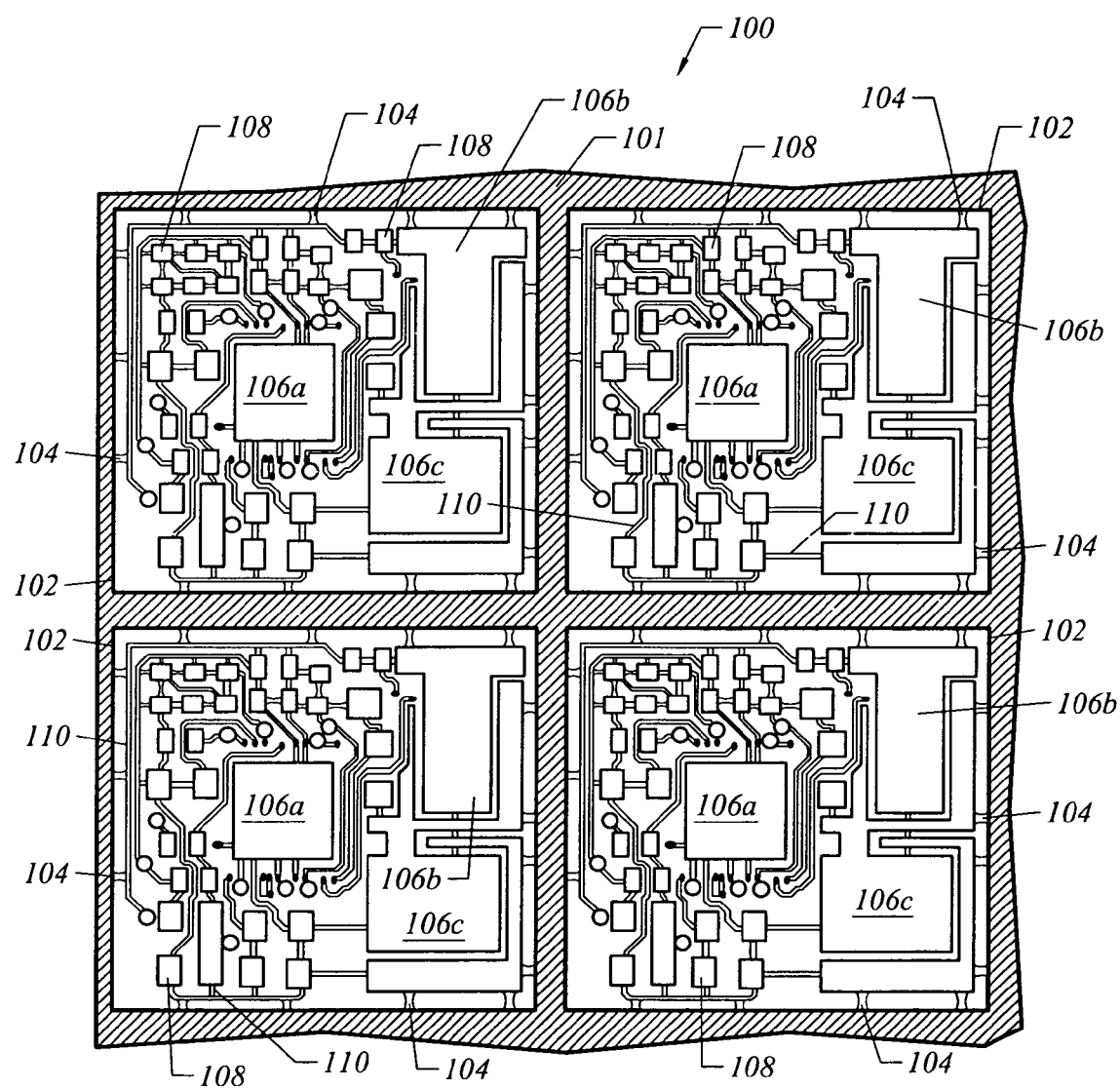
FIG. 2 is a plan view of an embodiment of the MLF substrate, according to the present invention.

FIG. 2 illustrates a lead frame template 100 according to one embodiment of the present invention. The lead frame template 100 is preferably manufactured from a single sheet of thermally and electrically conductive material 101. Copper (Cu), a Cu-based alloy, iron-nickel (Fe—Ni), a Fe—Ni-based ally, or the like is preferably used as the material for the lead frame template 101. It is within the scope and spirit of the present invention for the lead frame template 100 to comprise other materials. The single sheet of material 101 preferably has a surface material finish appropriate for soldering or applying other electrically and thermally conductive adhesion materials (e.g., conductive epoxy).

In this embodiment, four MLF substrates 102 have been formed into the single sheet of material 101. The lead frame template 100 may include more than or fewer than four MLF substrates 102. By way of example only, each MLF substrate 102 may be created through a stamping, etching, milling or laser manufacturing process. Each MLF substrate 102 is preferably attached to the single sheet of material 101 by more than one temporary connection bar 104. The temporary connection bars 104 secure the MLF substrate 102 in place with respect to the single sheet of material 101. As will be described later, the temporary connection bars 104 are eventually removed from each MLF substrate 102 and are not intended to provide an electrical connection between the semiconductor components in the final package.

The configuration of each MLF substrate 102 may vary. The number of semiconductor components that will be mounted on an MLF substrate 102 is dictated by the design requirements of the semiconductor package. FIG. 2 illustrates one embodiment of a MLF substrate 102. In this embodiment, the MLF substrate 102 includes semiconductor die pads 106a, 106b, 106c, termination pads 108, temporary connection bars 104, and permanent connection bars 110. The termination pads 108 shown in FIG. 2 are substantially rectangular in shape. It is within the scope and spirit of the invention for the termination pads 108 to comprise other shapes, such as, but no limited to oval, square, or circular.

In general, the design or layout of each MLF substrate 102 may be predetermined to meet the specific electrical requirements of the semiconductor package. For example, if each MLF substrate 102 is stamped out of the sheet of material 101, the stamping die may be configured to produce the exact number of semiconductor die pads 106 and termination pads 108 required for the semiconductor package. A strip of the material 101 is left between each MLF substrate 102 so that multiple MLF substrates 102 may be transported by a single sheet.

The termination pads 108 form a pattern or matrix within the MLF substrate 102. As discussed above, the pattern or matrix of termination pads 108 may vary greatly. The termination pads 108 generally provide two functions: (1) to provide a mounting surface for passive components (e.g., resistors R1, R2, R3, R4 shown in FIG. 6); and (2) to provide a mounting surface for bonding wires 240. Regardless of the pattern, the termination pads 108 are linked together by at least one temporary connection bar 104 and/or at least one permanent connection bar 110. A termination pad 108 may be linked to an adjacent termination pad 108 by more than one temporary connection bar 104 and/or more than one permanent connection bar 110. Initially, the temporary connection bars 104 and the permanent connection bars 110 provide rigidity to the MLF substrate 102.

Figure 3:
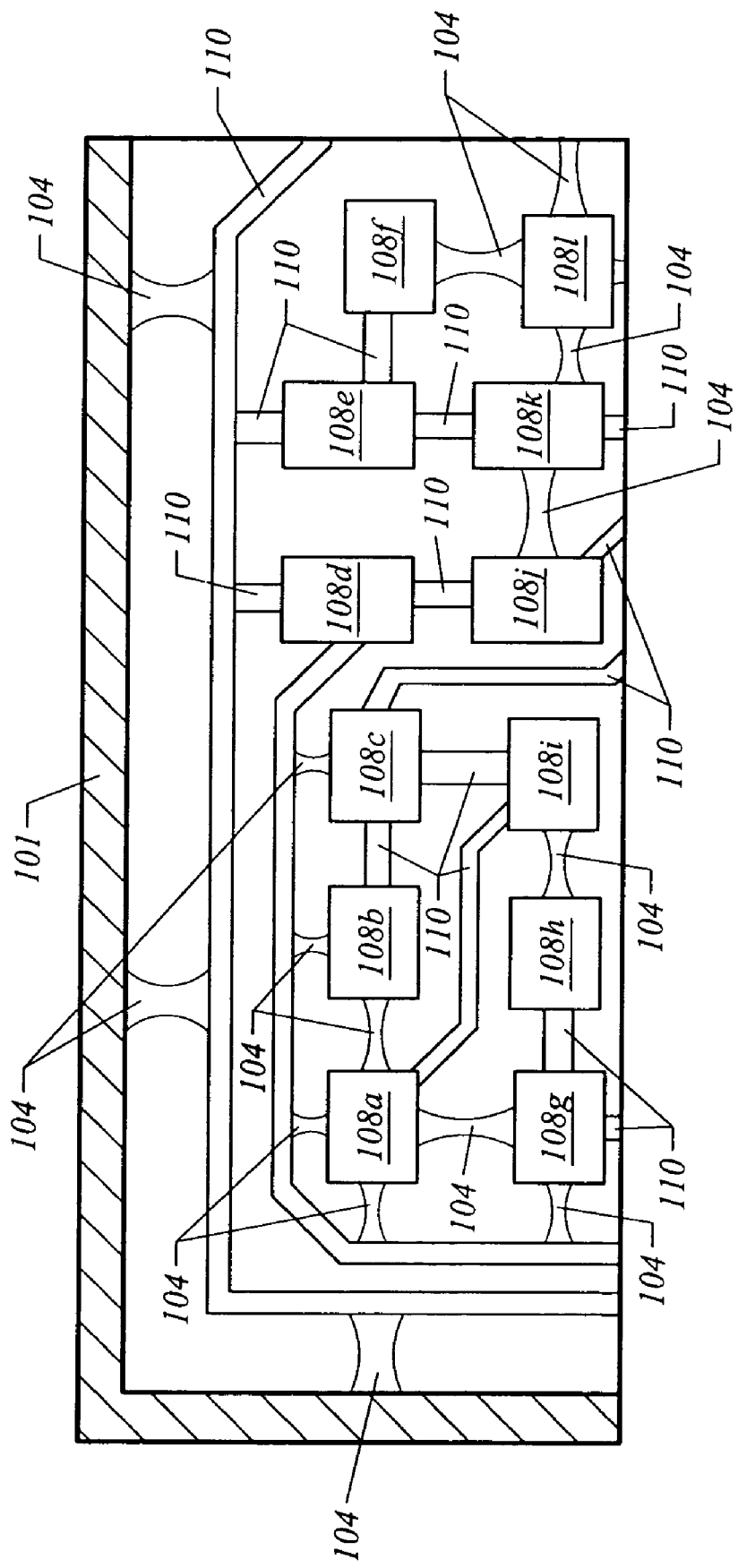
FIG. 3 is a partial plan view of the MLF substrate shown in FIG. 2.

FIG. 3 illustrates the connections between termination pads 108 in more detail. In general, adjacent termination pads 108 may be linked together in one of two ways: (1) the adjacent termination pads 108 are linked by a temporary connection bar 104 (e.g., termination pads 108a and 108g); or (2) the adjacent termination pads 108 are linked by a permanent connection bar 110 (e.g., termination pads 108g and 108h). More than one temporary connection bar 104 and/or permanent connection bar 110 may extend from a termination pad 108.

The portion of the MLF substrate 102 shown in FIG. 3 includes twelve termination pads 108a-108l. The connections between several of the termination pads 108 will now be described to provide examples of how the termination pads 108 may be linked together. The termination pad 108a has four temporary connection bars 104 and one permanent connection bar 110 extending from it. One temporary connection bar 104 links the termination pad 108a with the termination pad 108b. A second temporary connection bar 104 links the termination pad 108a to the termination pad 108g. The third and fourth temporary connection bars 104 link the termination pad 108a to a permanent connection bar 110 that is adjacent to the termination pad 108a. The permanent connection bar 110 links the termination pad 108a with the termination pad 108i. The four temporary connection bars 104 fix the termination pad 108a in place with respect to the surrounding elements of the MLF substrate 102 (e.g., termination pads 108, 108g) and create an electrical connection between the same elements.

The termination pad 108f illustrates that a termination pad 108 may be linked by fewer connection bars. The termination pad 108f is linked to the termination pad 108e by a permanent connection bar 110 and is linked to the termination pad 108l by a temporary connection bar 104. The permanent connection bar 110 and temporary connection bar 104 fix the termination pad 108e in place. In general, adjacent termination pads 108 are connected together by a single connection bar. It is within the scope and spirit of the present invention to link adjacent termination pads together by more than one connection bar.

Adjacent termination pads 108 may be linked together by all temporary connection bars 104 or all permanent connection bars 110. For example, the termination pad 108l is linked to adjacent termination pads by four temporary connection bars 104. Alternatively, the termination pad 108e is linked to adjacent termination pads only by permanent connection bars 110. Each temporary connection bar 104 is shown as having a different shape than the permanent connection bars 110 simply to illustrate which connection bars are temporary and which connection bars are permanent. It is within the spirit and scope of the present invention for the temporary and permanent connection bars 104, 110 to have the same shape or have a shape other than that shown in FIG. 3.

Figure 4:
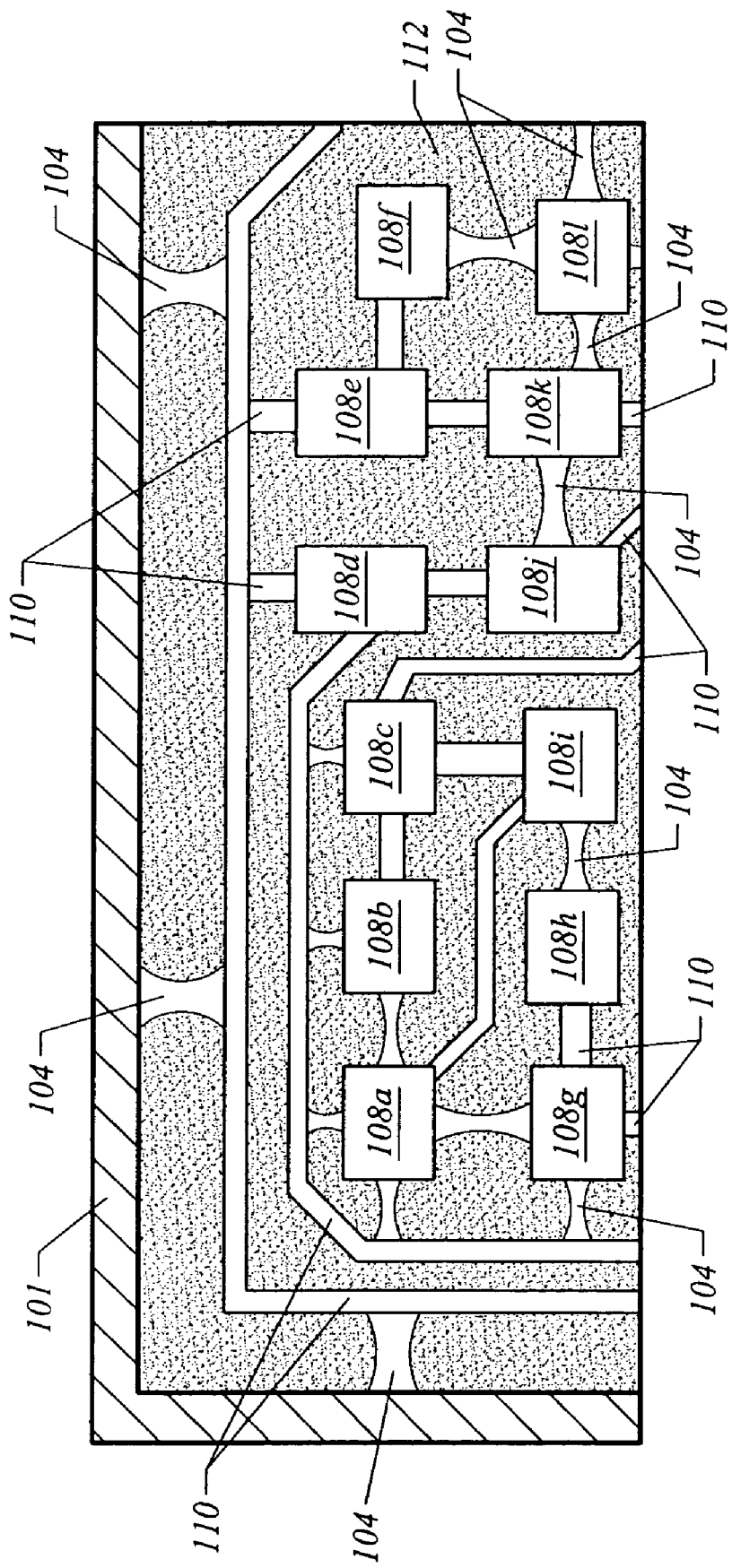
FIG. 4 is a partial plan view of the MLF substrate shown in FIG. 2, illustrating the a molding compound material applied to the MLF substrate.

FIG. 4 illustrates a molding compound 112 applied to the MLF substrate 102. The molding compound 112 fixes each components within the MLF substrate 102 (e.g., termination pads 108, semiconductor die pads 106, and connection bars 104, 110) in the molding compound 112. In a preferred embodiment, the molding compound 112 fills in the empty spaces or gaps throughout the MLF substrate 102. The gaps in the MLF substrate 102 are defined by the areas in which a semiconductor die pad 106, a termination pad 108, or the connection bars 104, 110 are not located within the MLF substrate 102. The molding compound 112 provides additional rigidity to the MLF substrate 102 in addition to the permanent connection bars 110 and the temporary connection bars 104. The molding compound 112 is preferably an epoxy-resin or another electrically insulating material.

The molding compound 112, when applied to the MLF substrate 102, preferably does not cover the top or bottom surface of the semiconductor die pads 106 or the termination pads 108, since they provide mounting surfaces for the semiconductor dice and passive components. The molding compound 112 is therefore preferably thinner than the sheet of material 101. If the molding compound 112 initially covers a semiconductor die pad 106 or a termination pad 108, the surface of the pad may be milled or etched to remove the molding compound 112. In a preferred embodiment, the temporary connection bars 104 and permanent connection bars 110 are not covered by the molding compound 112 either. However, it is within the spirit and scope of the present invention to cover the temporary and permanent connection bars 104, 110 with the molding compound 112.

Figure 5:
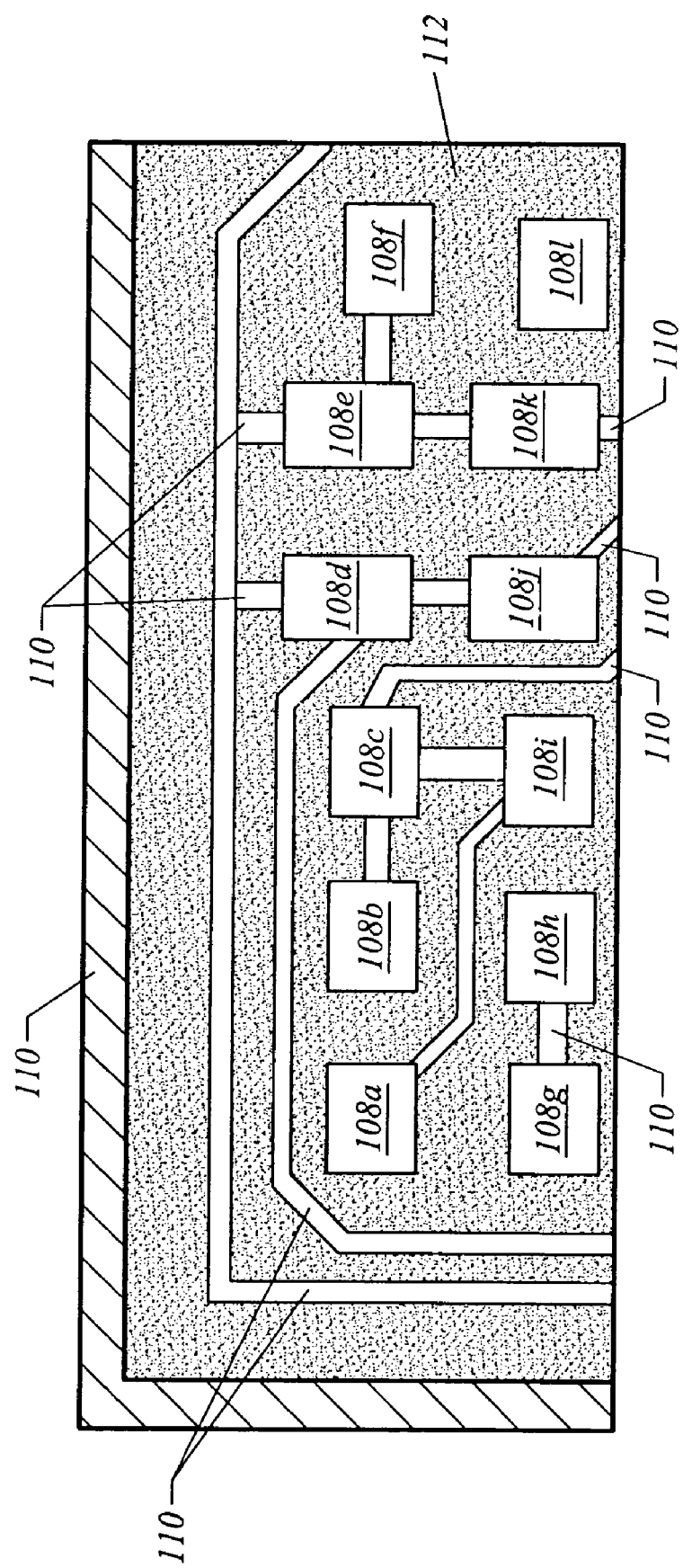
FIG. 5 is a plan view of the MLF substrate shown in FIG. 4, illustrating the MLF substrate after the temporary connection bars have been removed.

FIG. 5 illustrates that the temporary connection bars 104 are preferably removed from the MLF substrate 102, after the molding compound 112 has been applied. Thus, the components of the MLF substrate 102 (e.g., the termination pads 108, the permanent connection bars 110, and semiconductor die pads 106) are held in place primarily by the molding compound 112. As shown in FIG. 5, a termination pad 108, if linked to an adjacent termination pad 108 at all, is linked only by a permanent connection bar 110. The remaining permanent connection bar 110 provides an electrical connection between the linked termination pads 108. For example, the termination pad 108a initially had four temporary connection bars 104 and one permanent connection bar 110 extending from it when the MLF substrate 102 was initially formed (see FIGS. 2-3). Once the temporary connection bars 104 are removed, the termination pad 108a is only linked to the termination pad 108i by a single permanent connection bar 110.

The temporary connection bars 104 may be removed at later stages of the manufacturing process. The temporary connection bars 104 simply must be removed prior to electrical testing of the package. Otherwise, the temporary connection bars 104 will provide unwanted electrical connections between termination pads 108. In an alternative embodiment, the temporary connection bars 104 are removed through a back etching process after the semiconductor components are mounted on the MLF substrate 102 (discussed later).

An adhesive tape (not shown), preferably made of epoxy resin, polyamide resin, polyester resin or the like, may be attached to the bottom surface of the MLF substrate 102 to further stabilize the MLF substrate 102. Adhesive tape is known to persons skilled in the art and does not require further disclosure. If an adhesive tape is applied to the MLF substrate 102, it is preferably applied to the MLF substrate 102 prior to mounting the semiconductor components on the MLF substrate 102.

After the tape is applied to the bottom surface (see FIG. 8B) of the MLF substrate 102, the semiconductor elements are mounted to the top side (see FIG. 8B) of the MLF substrate 102. There are many methods known within the art for mounting semiconductor components within a package. By way of example only, the MLF substrate 102 may be screen-printed with a solder paste in a pattern that corresponds to the pattern of the passive components that will be mounted on the termination pads 108. Each passive component is then positioned on a corresponding pair of termination pads 108 and the solder is reflowed using conventional surface mount technology. Alternatively, the mounting surfaces of the passive components may be printed with solder paste and then mounted on the pair of termination pads 108. Other methods for mounting semiconductor components are known within the art and do not require further disclosure.

Figure 6:
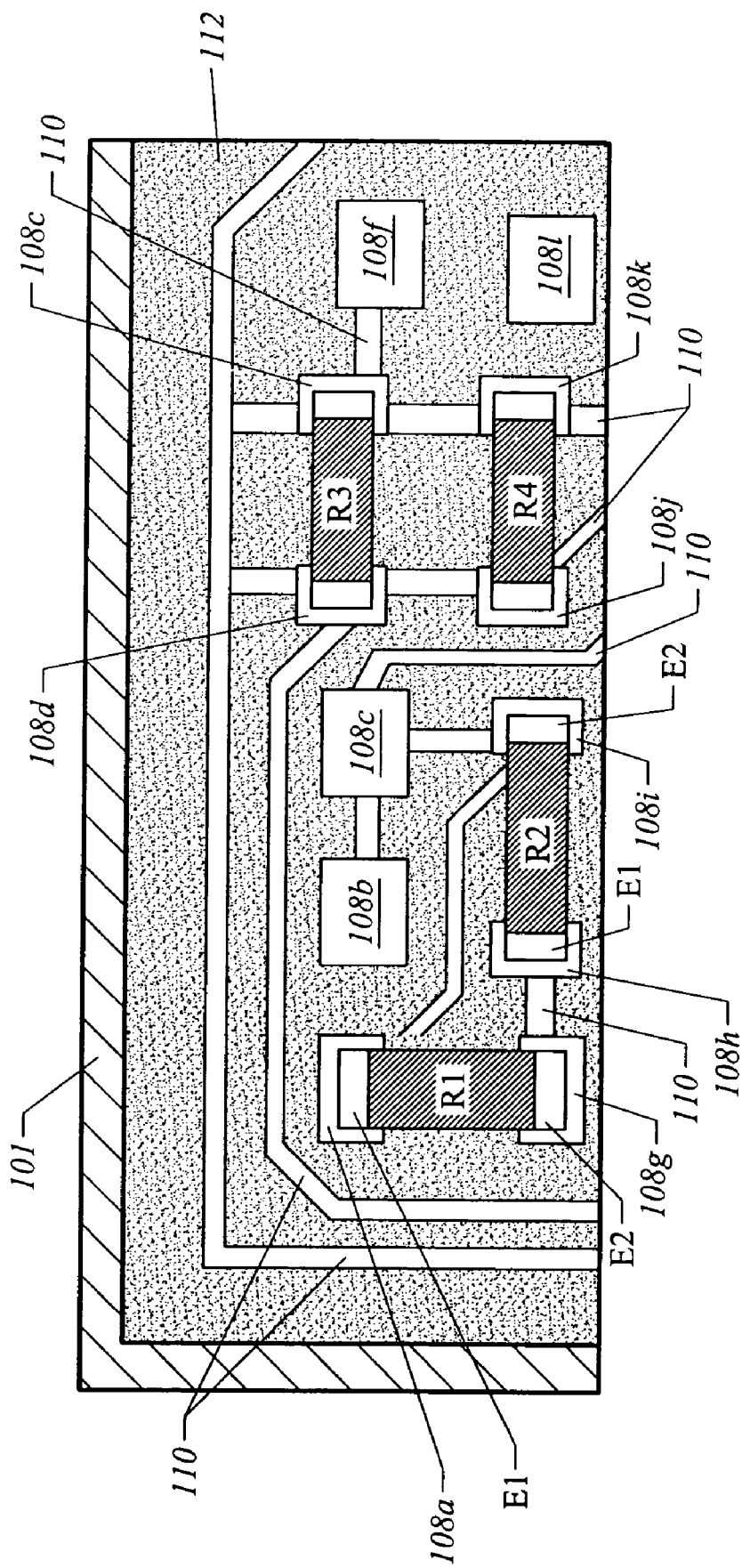
FIG. 6 is a plan view of the MLF substrate shown in FIG. 5, illustrating several discrete passive components mounted on the MLF substrate.

FIG. 6 illustrates one embodiment of the MLF substrate 102 with passive components disposed between several of the termination pads 108. In this embodiment, the resistors R1, R2, R3, R4 are disposed between several of the termination pads 108. Each resistor is electrically connected by its leads on a termination pad 108. For example, the resistor R1 is connected by its lead E1 to the termination pad 108a and is connected to the termination pad 108g by its lead E2. Similarly, the resistor R2 is connected by its lead E1 to the termination pad 108h and is connected to the termination pad 108i by its lead E2.

As previously discussed, the termination pads 108a and 108i and the termination pads 108g and 108h are each electrically coupled together by a permanent connection bar 110. The resistor R1 electrically couples the termination pads 108a and 108g together. The resistor R2 electrically couples the termination pads 108h and 108i together. The resistors R1 and R2 are thus electrically coupled together. The resistors R3 and R4 are similarly electrically coupled together.

In this embodiment, passive components are not mounted on the termination pads 108b, 108c, 108f, 108l. Thus, the termination pads 108b, 108c, 108f, 108l provide mounting surfaces for bonding wires. Bonding wires 240, such as a gold wires, are connected between each termination pad 108b, 108c, 108f, and 108l and an external lead 232 (see FIG. 7) of the semiconductor package 200 using a conventional wire-bonding process.

Figure 7:
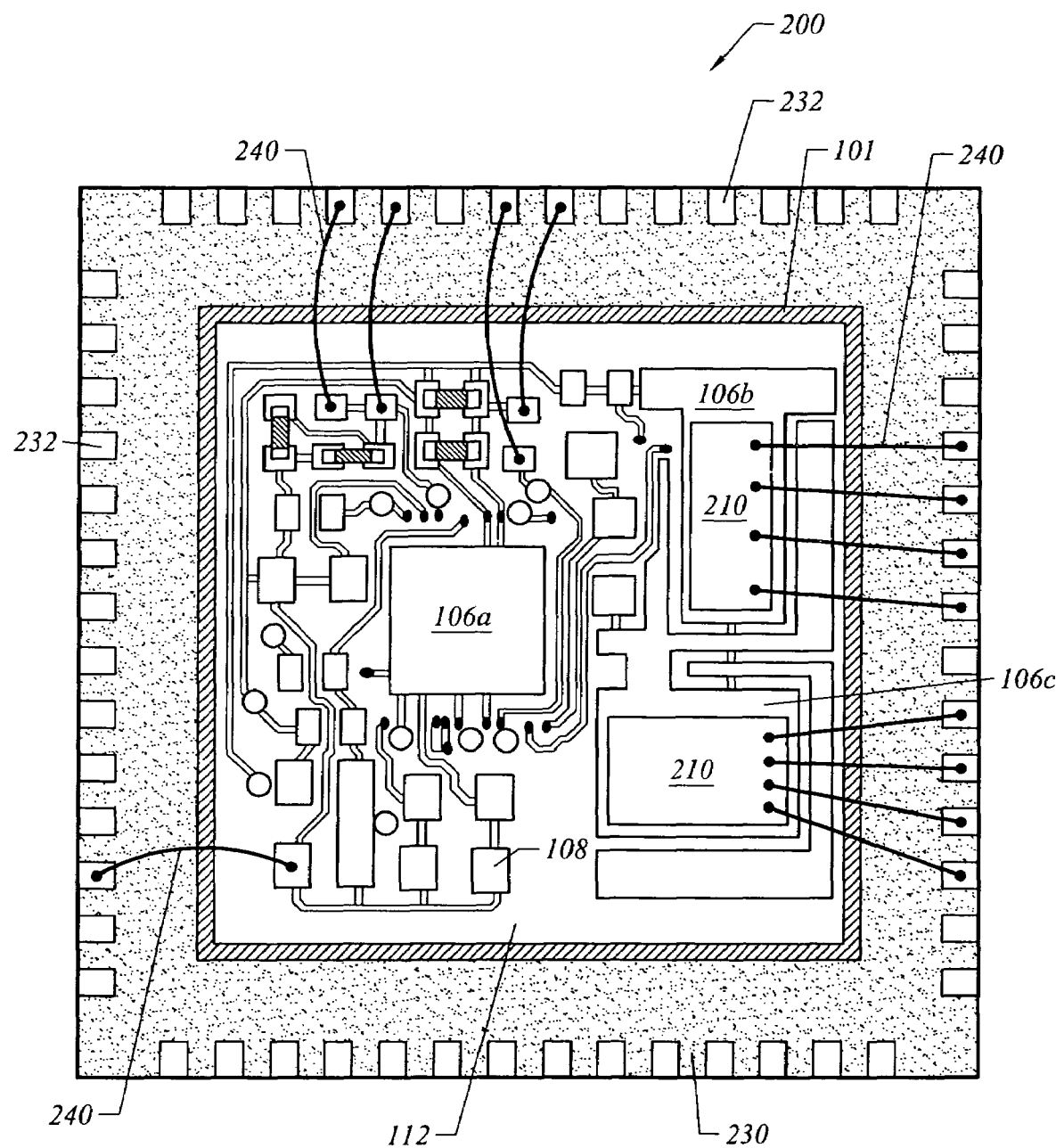
FIG. 7 is a plan view of an embodiment of a lead frame package incorporating the MLF substrate.

Each semiconductor die pad 106 is adapted to receive a power semiconductor die 210 (e.g., a MOSFET or a controller device 212 (e.g., a PWM controller, a controller ASIC, etc.). The power semiconductor dice 210 and controller devices 212 may be mounted on each semiconductor die pad 106 prior to or after the passive components (e.g., R1-R4) are mounted on the MLF substrate 102. As shown in FIG. 7, the MLF substrate 102 includes two power semiconductor dice 210—one mounted on the semiconductor die pad 106b and one mounted on the semiconductor die pad 106c. A controller device 212 is mounted on the semiconductor die pad 106a. Each power semiconductor die 210 includes bonding pads (not shown). Bonding wires 240 electrically connect the bonding pads of the power semiconductor die 210 to the leads 232 of the lead frame 230. The embodiment shown in FIG. 7 is merely illustrative. The configuration of the semiconductor package 200 may vary according to the performance requirements of the package.

The top surface of the MLF substrate 102 is sealed with a molding material after the passive components, the power semiconductor dice 210, and the controller devices 212 are mounted on the MLF substrate 102 and the wire bonding is complete. After the molding material is cured, the adhesive tape is removed from the bottom surface of the MLF substrate 102.

As previously discussed, the temporary connection bars 104 do not have to be removed from the MLF substrate 102 immediately after the molding compound 112 is applied to the MLF substrate 102. The temporary connection bars 104 may remain within the MLF substrate 102 through all of the manufacturing steps discussed above. In an alternative embodiment, the temporary connection bars 104 are removed after the adhesive tape is removed from the MLF substrate 102. A back etching process is performed after the tape is removed to remove the temporary connection bars 104 from the MLF substrate 102. The back etching process creates holes in the molding material 112 where the temporary connection bars 104 were removed. The holes are preferably filled in by applying additional molding compound to the back side of the MLF substrate 102.

FIG. 7 illustrates a lead frame package 200 that incorporates the MLF substrate 102. The lead frame package 200 includes a housing 230 that has leads 232 about its periphery. The sheet of material 101 is eventually divided into single units—each unit including a single MLF substrate 102. This process is commonly known within the industry as singulation. Each unit is then mounted on the housing 230. The lead frame package 200 is preferably encapsulated in a package body in a manner such that the bottom surface of each lead 232 has at least a portion exposed from the bottom of the package body for making an external electrical connection. The molding material has been removed to illustrate the interior of the lead frame package 200.

The lead frame package 200 shown in FIG. 7 comprises two power semiconductor dice 210. Each semiconductor die 210 may be attached to the semiconductor die pad 106 by an adhesive such as silver paste and the silver paste is cured after die attach. The active surface of each semiconductor die 210 includes a plurality of bonding pads (not shown). Each bonding pad is electrically connected to a lead 232 by a bonding wire 240. The termination pads 108 that do not have a passive component mounted to it provide a mounting surface for the bond wires 240. Several of the termination pads 108 are shown as electrically connected to a lead 232 by a bonding wire 240. The configuration of the lead frame package 200 shown in FIG. 7 may vary and is not intended to limit the scope of the present invention. The package 200 includes power semiconductor components and passive components may then be mounted onto the customer's circuit board.

Figure 8A:
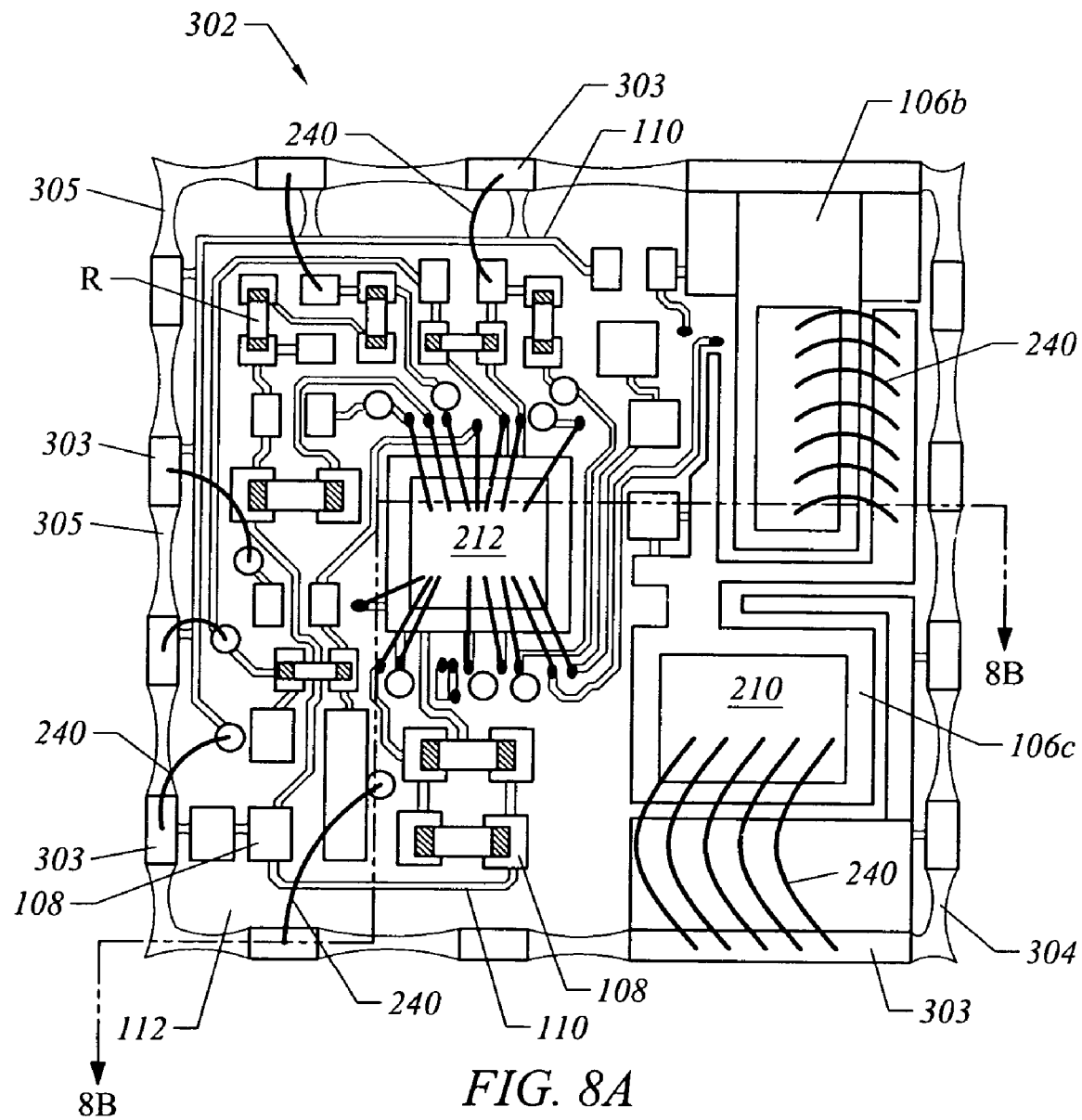
FIGS. 8A-8C illustrate a second embodiment of the MLF substrate, according to the present invention.
Figure 8B:
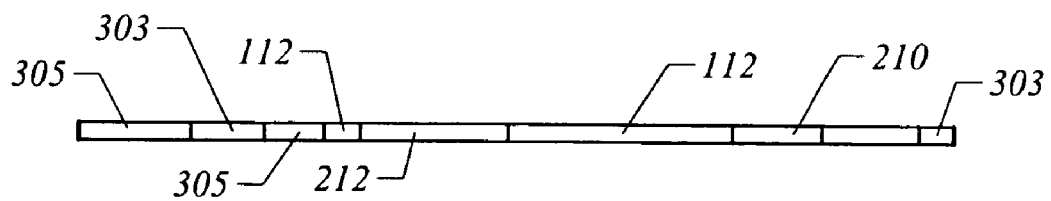
Figure 8C:
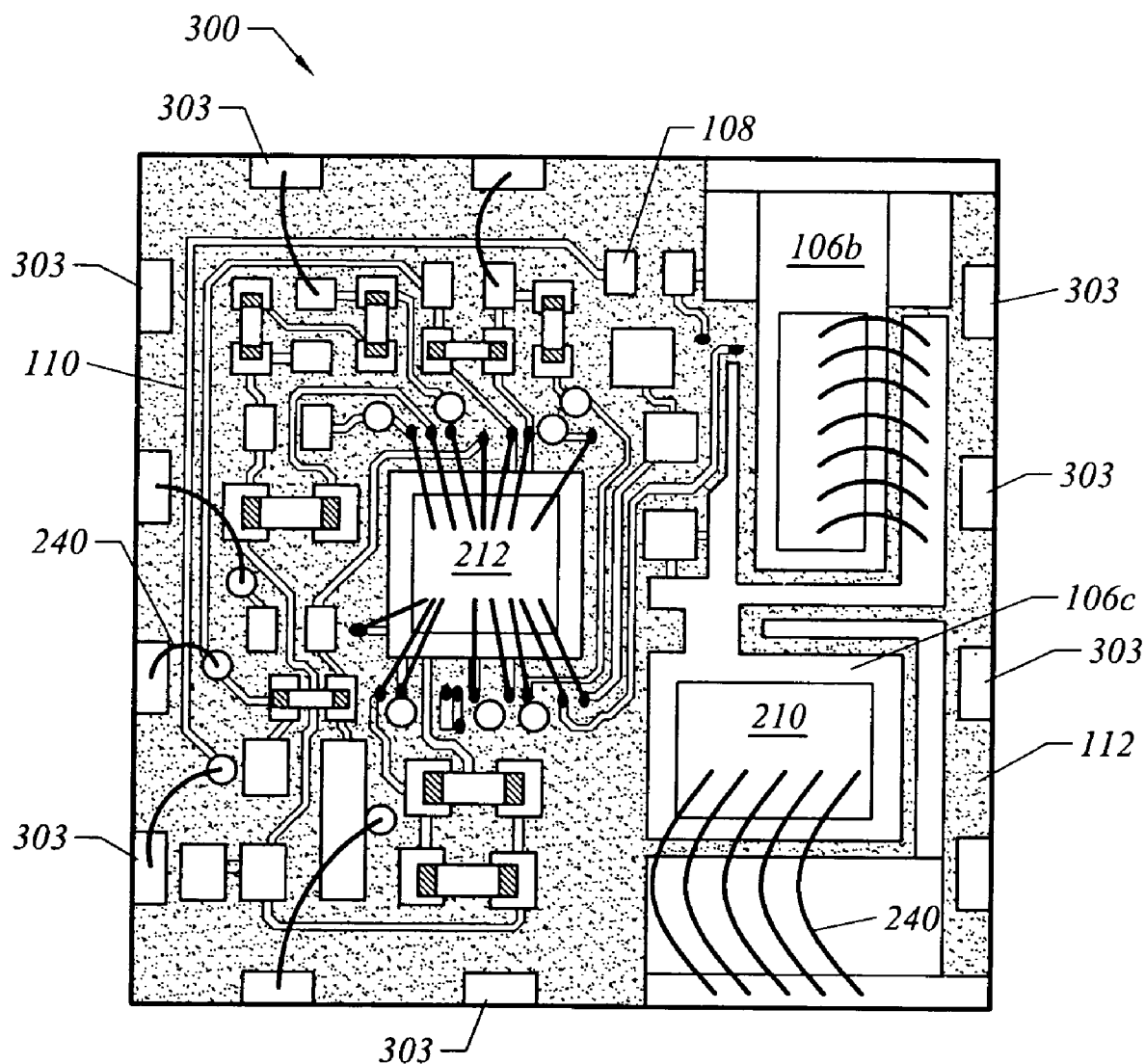

FIGS. 8A-8C illustrate yet another embodiment of an MLF substrate. In this embodiment, the MLF substrate 302 mounts directly onto the customer's circuit board. The configuration of the MLF substrate 302 is substantially similar to the MLF substrate 102 shown previously in FIGS. 2-6. Components within the MLF substrate 302 that are similar to the MLF substrate 102 (e.g., termination pads 108, permanent connection bars 110, etc.) retain the same reference numeral.

The MLF substrate 302 comprises a unitary construction from the sheet of material 301 similar to the MLF substrate 102. Regardless of the manufacturing process, each MLF substrate 302 shown in FIG. 8A includes an outer frame 304 that connects the MLF substrate 302 to the single sheet of material 301 (see FIG. 9A). The outer frame 304 comprises permanent leads 303 and temporary leads 305. The temporary leads 305 fix the MLF substrate 302 and similar to the temporary connection bars 104, are eventually removed from the MLF substrate 302 before the MLF substrate 302 is electrically tested. The temporary connection bars 104 and the temporary leads 305 may be removed simultaneously or at different stages of the manufacturing process. As shown in FIGS. 8A and 8C, the semiconductor dice 210 and the termination pads 108 electrically couple directly to the permanent leads 303 via at least one bonding wire 240.

Removing the temporary leads 305 from the MLF substrate 302, in effect, transforms the MLF substrate 302 into a leadless package (see FIG. 8C). The MLF substrate 302 may therefore mount directly on the customer's circuit board. As previously discussed above, the molding material 112 fills in the gaps of the MLF substrate and does not cover the bottom surface of the semiconductor dies pads 106 or the bottom surface of the terminations pads 108. In this embodiment, the MLF substrate 302 has a substantially uniform thickness, shown as h in FIG. 8B. Thus, the entire bottom surface 310 of MLF substrate 302 contacts the circuit board. One advantage of the MLF substrate 302 is that the heat dissipated from each power semiconductor die 210 is transferred directly from its bottom surface, through the semiconductor die pad 106, and onto the customer's circuit board—providing low thermal resistance. A drawback, however, is that the non-conductive portions of the MLF substrate 302 (e.g., molding compound 112) also contact the circuit board. A conventional practice within the industry is to run tracks or traces along the top surface of the circuit board, which, in this embodiment, is located under the MLF substrate 302. The entire bottom surface 310 of the MLF substrate 302 contacts the circuit board, when the MLF substrate is mounted on the circuit board with no space between the bottom surface 310 of the MLF substrate 302 and the top surface of the circuit board, a customer cannot run traces along the top surface of the circuit board.

Figure 9A:
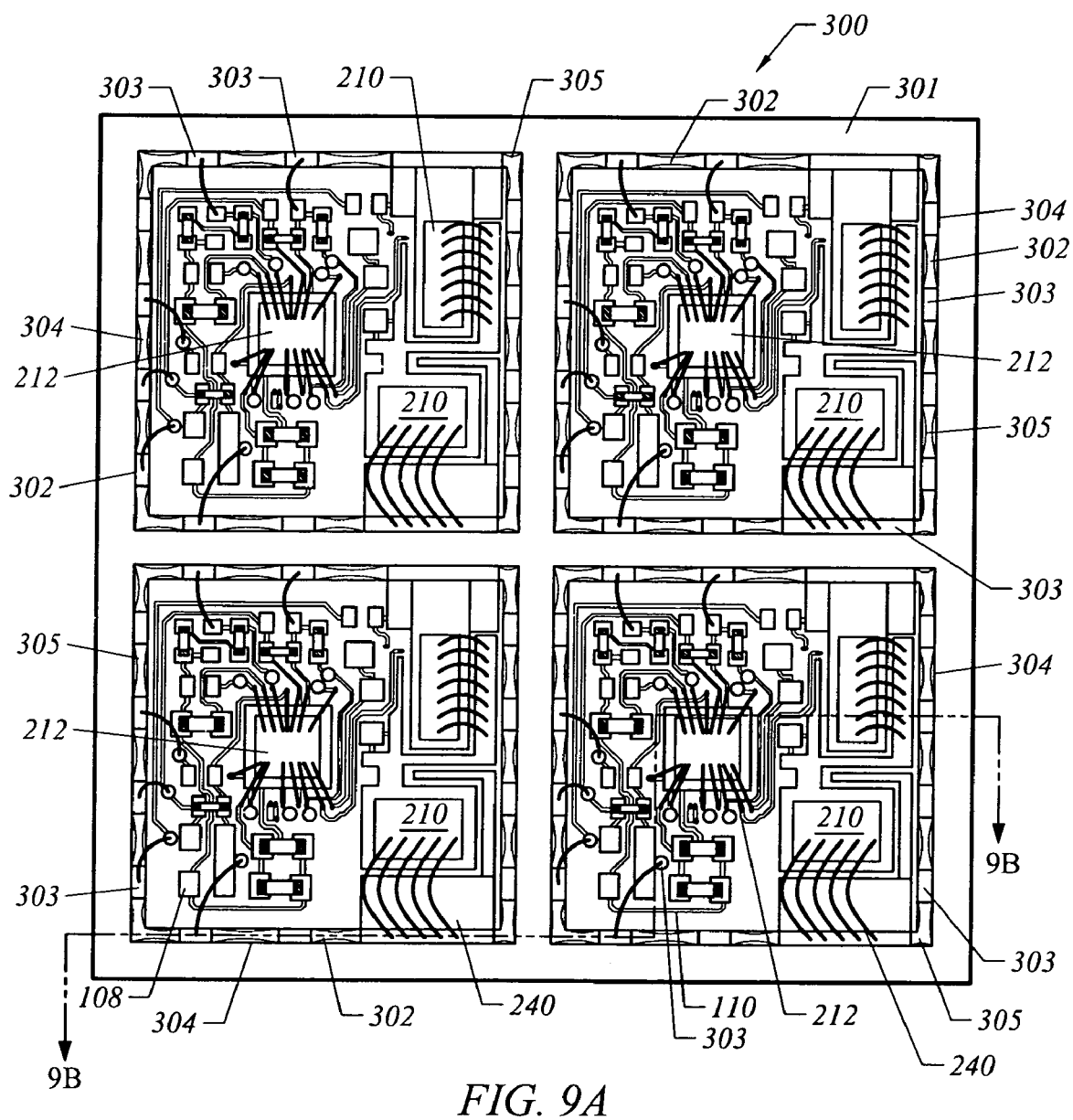
FIGS. 9A-9B illustrate a third embodiment of the MLF substrate, according to the present invention.
Figure 9B:
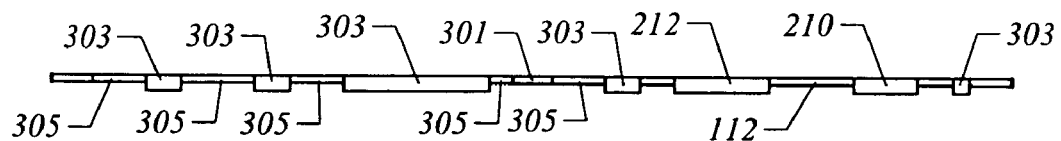

FIGS. 9A-9B illustrate still another embodiment of the MLF substrate 302. In this embodiment, the bottom surface 310 of the MLF substrate 310 has a stepped feature to allow a customer to run traces along the top surface of the circuit board. FIG. 9A illustrates four MLF substrates 302 formed into a single sheet of material 301. The lead frame template 300 may include more than or fewer than four MLF substrates 302. By way of example only, each MLF substrate 302 may be created through a stamping, etching, milling or laser manufacturing process.

Regardless of the manufacturing process, each MLF substrate 302 shown in FIG. 9A is connected to the single sheet of material 301 by the permanent leads 303 and the temporary leads 305. In contrast to the MLF substrate 302 shown in FIGS. 8A-8C, the MLF substrate shown in FIG. 9B has a stepped feature on the bottom or contact surface 312. In this embodiment, only the pads that are required to operate the package (e.g., permanent leads 303 and semiconductor die pads 106) contact the circuit board when the MLF substrate 302 is mounted on the circuit board. The stepped feature of the MLF substrate 302 is preferably formed when the MLF substrate 302 is initially created. As shown in FIG. 9B, the bottom surface 312 of the MLF substrate 302 provides the semiconductor die pads 106 permanent leads 103 that extends out further than the molding material 112. When the MLF substrate 302 is mounted on the circuit board, gaps 314, are created between leads 303, that traces can be run between. The gaps 314 also provide advantages to cleaning the circuit board. For example, the raised bottom surface of the MLF substrate 302 allows cleaning of the circuit board with standard cleaning equipment while minimizing the potential for trapping water, flux, etc. under the MLF substrate 302, which will lead to electro migration and the like.

The foregoing description of preferred embodiments of the present invention has been provided for the purposes of illustration and description. It is not intended to be exhaustive or to limit the invention to precise forms disclosed. Obviously, many modifications and variations will be apparent to practitioners skilled in the art. The embodiments were chosen and described in order to best explain the principles of the invention and its practical application, thereby enabling others skilled in the art to understand the invention for various embodiment and with various modifications as are suited to the particular use contemplated. It is intended that the scope of the invention be defined by the following claims and their equivalents.

The invention claimed is:

1. A lead frame substrate, comprising:
a plurality of connection bars;
a semiconductor die pad being adapted to receive a semiconductor die;
a plurality of termination pads being linked together and to said semiconductor die pad by said plurality of connection bars, each one of said plurality of termination pads being adapted to receive a passive component and a bonding wire; and
a molding compound fixing said semiconductor die pad, said plurality of termination pads, and said plurality of connection bars together;
wherein said semiconductor die pad, said plurality of termination pads, and said plurality of connection bars include a top and bottom surface, and said molding compound leaves said top and bottom surfaces uncovered.

2. The lead frame substrate according to claim 1, wherein said semiconductor die pad, said plurality of termination pads, and said plurality of connection bars comprise a thermally and electrically conductive material.

3. The lead frame substrate according to claim 2, wherein said thermally and electrically conductive material comprises copper.

4. The lead frame substrate according to claim 1, wherein said semiconductor die pad, said plurality of termination pads, and said plurality of connection bars have a unitary construction from a common piece of material.

5. The lead frame substrate according to claim 1, further comprising a plurality of leads located around a periphery of the lead frame substrate.

6. The lead frame substrate according to claim 1, wherein said at least one permanent connection bar electrically couples said semiconductor die pad to at least one of said plurality of termination pads.

7. The lead frame substrate according to claim 1, wherein said at least one permanent connection bar electrically couples selected ones of said plurality of termination pads together.

8. The lead frame substrate according to claim 1, wherein said plurality of connection bars comprises permanent connection bars and temporary connection bars.

9. The lead frame substrate according to claim 8, wherein said temporary connection bars are adapted to be removed from the lead frame substrate after said molding compound has fixed said semiconductor die pad, said plurality of termination pads, and said plurality of connection bars together.

10. The lead frame substrate according to claim 1, wherein the lead frame substrate comprises a substantially uniform thickness.

11. The lead frame substrate according to claim 1, wherein the lead frame substrate is adapted for being mounted to a circuit board.

12. The lead frame substrate according to claim 11, wherein only said semiconductor die pad and said plurality of leads contact the circuit board when the lead frame substrate is mounted on the circuit board.

* * * * *